United States Patent [19]

Szepesi

[11] Patent Number: 5,018,041
[45] Date of Patent: May 21, 1991

[54] CIRCUIT FOR INTERNAL CURRENT LIMITING IN A FAST HIGH SIDE POWER SWITCH

[75] Inventor: Tamas S. Szepesi, San Jose, Calif.

[73] Assignee: National Semiconductor Corp., Santa Clara, Calif.

[21] Appl. No.: 367,458

[22] Filed: Jun. 16, 1989

[51] Int. Cl.$^5$ .............................................. H02H 3/20
[52] U.S. Cl. ...................................... 361/18; 361/86; 361/88
[58] Field of Search ................. 361/18, 45, 87, 89–91; 333/50, 55, 56

[56] References Cited

U.S. PATENT DOCUMENTS

| | | | |
|---|---|---|---|
| 4,021,701 | 5/1977 | Davies | 361/18 |
| 4,441,136 | 4/1984 | Hampshire | 361/86 X |
| 4,703,390 | 10/1987 | Fay et al. | 361/18 X |
| 4,819,117 | 4/1989 | Brennan | 361/110 X |

OTHER PUBLICATIONS

*A 30A 30V DMOS Motor Controller and Driver,* I.E.E.E. International Solid State Circuits Conference, Digest of Technical Papers, pp. 192–193 and 365–366 (Feb. 18, 1988).

Primary Examiner—Todd E. DeBoer
Attorney, Agent, or Firm—Limbach, Limbach & Sutton

[57] ABSTRACT

A current limiting circuit (200, 300, 400) for instantaneously limiting the peak current of a fast high side power switch (212) or power FET has a reference switch (213) or FET, a first comparator (218), a current source $I_{CL}$, control circuitry (209), and a clamping circuit (238). The reference FET (213) is smaller than the power FET (212). The first comparator compares the voltage drop across the power FET (212) and compares it with the voltage drop across the reference FET (213) and produces a signal COMPOUT which initiates the turn-off of the power FET (212) if the voltage drop across the power FET (212), caused by a load current flowing through it, is greater than or equal to the reference FET voltage drop induced by $I_{CL}$. The clamp circuit (238), having diodes ($D_1$, $D_2$) and a tracking current source $I'_{CL}$, disconnects the FETS (212, 213) from the comparator (218) when they are OFF. The circuit (200, 300, 400) may also have a second comparator (250) which protects the power switch (212) from a short circuit condition in the circuit (200, 300, 400).

20 Claims, 7 Drawing Sheets

CIRCUIT FOR INTERNAL CURRENT LIMITING IN A FAST HIGH SIDE POWER SWITCH

TECHNICAL FIELD

The present invention broadly relates to power circuitry, especially of the type employing a control circuit for limiting the current in a power switch and more particularly the invention involves limiting the current in a high side switch and protecting the switch from short circuits.

BACKGROUND OF THE INVENTION

In integrated circuits, control circuitry is often integrated with the power circuitry for protecting the switching elements from excessive current, voltage, temperature, etc. Two conventional current limiting circuits are the "Classic" power MOS circuit and the current mirror circuit.

Referring to FIG. 1, the "classic" power MOS circuit 10 having a MOS FET 12, a current-sense resistor ($R_S$), an amplifier 16 with fixed gain ($A_I$), a comparator 18, a lowpass filter 20 and a flip flop 22 is shown.

The classic circuit 10 is a "low-side" power switch since the switching circuitry 10 is located beneath a load 24 and between ground 26. $R_S$ carries the entire load current $I_L$ and senses the current. $R_S$ typically has a small sense resistance in order to minimize the power dissipated across the sense resistor, $R_S$. The voltage is amplified by the amplifier 16 and input into the comparator 18 for comparison with a reference voltage, $V_{CL}$. $V_{CL}$ is the current limit voltage and it is selected, knowing the resistance of $R_S$, to correspond to the particular current limiting threshold so that when the voltage across $R_S$ is greater than or equal to $V_{CL}$, the current limit circuit 10 cuts off further current flow though the FET 12. When the voltage across $R_S$ is greater than or equal to $V_{CL}$, the comparator 18 outputs a signal 34 which the flip flop 22 responds to. The flip flop 22, in the example, is a Q flip flop. Thus if the signal out of the comparator 18 is high, $\bar{Q}$out is low, and an invertor 36 inverts $\bar{Q}$ which shuts off the FET switch 12.

The signal out of the switch 12 is filtered by the low pass filter 20 prior to amplification in order to filter out any false current spikes which occur when a diode (not illustrated) from the load 24 is reverse biased. The diode does not shut off instantaneously and thus false current spikes are generated as the diode acts like a short circuit initially. If the spikes are not filtered then the comparator 18 may output incorrect comparison results.

While the circuit 10 is simple to construct, it has several disadvantages: a large amount of power is dissipated in $R_S$; in a fully internal current limit, the temperature coefficient $T_C$ of $R_S$ needs to be accounted for since the resistance of $R_S$ changes with temperature; and a lowpass filter 20, or a comparable device, is necessary to protect against false limit triggering during the recovery-time of the external catch diode.

In addition, since the reverse recovery time of conventional diodes falls within a range that covers usually more than an order of magnitude (e.g., between 25 nsec and 350 nsec), the attainable minimum pulse-width, during the current-mode operation, is limited to accommodate for poor diode recovery time. The longer the recovery time (diode), the more limited the smallest duration of ON time that can be controlled. Thus, the circuit 10 is slowed since the pulse-width has to be large enough to accommodate for the diode recovery time, and thus, the circuit is not well suited for use in fast circuits.

Referring to FIG. 2, a conventional sense-FET or current mirror circuit 50 having two MOS FETs 52, 53 in parallel is shown. The first MOS FET 52 is called the Power FET (or Power Switch) since it is larger than the second MOS FET 53, called the Sense FET. The FETS 52, 53 have the same characteristics since they are fabricated on the same silicon wafer. The current mirror circuit 50 is a low side power switch since the switch circuitry is below the load 64 and between ground 66. Unlike the classic circuit 10, the current mirror circuit 50 does not measure the current through the power switch 52. Rather, the load current IL is mirrored at a lower level through the sense FET 53. The current $I_S$ in the sense FET 53 is much smaller than the current $I_P$ in the power FET 52. However, since the two FETS 52, 53 have substantially the same characteristics, the devices are proportional to one another. The current $I_P$ in the power FET 52 can be determined if the sense FET current $I_S$ is known, since the two currents $I_P$, $I_S$ are related to one another.

Using a sense FET 53 reduces the amount of power that is dissipated in $R_S$ because, although the sense FET 53 mimics the power FET current $I_P$, it does so at a substantially lower magnitude of current than the power FET current IP; (e.g., $I_S$ is 0.05% of $I_P$). Hence, $R_S$ only carries approximately 1/2000 to 1/10000 of the total power from the load 64. This is because the sense FET 53 is made substantially smaller than the Power FET 52.

The current in the sense FET $I_S$ is sensed and, filtered prior to being amplified by amplifier 56. The amplified signal is compared with a current limit voltage signal $V_{CL}$ in a comparator 58.

Again when the voltage dropped through $R_S$ is greater then $V_{CL}$, the comparator 58 outputs a signal which triggers a flip flop 72; the signal out of the flip flop 72 is inverted by inverter 76 and the Power Switch 52 is switched OFF. The comparator 58 does not switch ON the power FET 52 until after the reverse recovery current moves through the power FET 52.

While, the current mirror circuit 50 alleviates the power dissipation problem in $R_S$, the current mirror circuit 50 has the same disadvantages as the classic circuit 10. The circuit 50 also has the disadvantage of being nonlinear, which is undesirable in some applications. It is difficult to use this design in high-side switches because the point normally assumed to be ground or an unchanging potential in low-side switches is the point, in high-side switches, which is connected to the load, and thus the voltage continuously changes.

Reference is now made to FIG. 3 wherein the sense-FET current limit circuit 80 is used in a high-side switch. In the high-side switch, the sense FET circuit 80 is similar to the current mirror circuit 50, except that the sensing circuitry 80 is located above the load 94 and ground: the Power FET 82 and sense FET 83 are located between the power supply $V_S$. Hence, $V_{CL}$ is referenced to the output of the power switch 82; not to ground as in the low-side switch 50.

In a high-side switch, the common mode input voltage 84, of the current amplifier 86 and the comparator 88 are tied to the output of the power switch 82 and thus, the common mode input voltage 84 is equivalent to the output of the power switch 82.

The disadvantage with this design is that the output of the power switch 82 moves at an extremely high speed of approximately 500–1000 V/μsec between ground and V$_S$ during every on-off cycle.

In A 30A 30V DMOS Motor Controller and Driver, I.E.E.E. International Solid-State Circuits Conference (Feb. 18, 1988), a circuit for a current limiting operational amplifier having a sensing resistor and sense FET used in a FIG. 3-type configuration is believed to be illustrated. The circuit has a power FET and a sense FET and uses the voltage drop across a sensing resistor R$_s$ to sense the source current of the power FET. The circuit also has two comparator circuits, one being used when the power FET is ON and the other being used when the power FET is OFF.

SUMMARY OF THE INVENTION

The invention is directed to a current control circuit for use in a switching regulator circuit. The current control circuit has a power device, which is turned off and on to supply current to a load over a periodic, controllable duration of time, and the circuit is responsive to the voltage drop across the power device. The power device has an internal resistance when it is conducting current so that there is a current limit voltage drop across the power device when current flowing through the power device is at a level at which current limiting is desired. The current control circuit has means responsive to the voltage drop across the power device to switch off the power device when the current limit voltage is reached.

The current limit voltage may be determined by the circuit having a reference means coupled to the power device for providing a value of resistance which tracks or mimics change in the resistance of the power device. The reference means is biased by a reference current source which sets up a current limit voltage on the reference means. The voltage drop across the reference means and the power device may be compared to determine when the current limit level has been reached.

The circuit may have biasing means for biasing the circuit when the power device is turned off to provide reference current with a current path. In addition, the circuit also has means for monitoring the voltage drop across the power device and switches off the power device if the voltage drop across the power device is not below a preselected level during a preselected time period.

It is therefore a primary object of the invention to provide a circuit to internally limit the current in fast high side power switches.

Another object of the invention is to utilize the On resistance of the circuit's power switch as a sense resistor.

A further object of the invention is to provide a circuit which limits the common mode voltage range of the current limit comparator and keeps it in the active linear operating mode during both the on and off times of the power switching element to provide the fastest possible current limit operation.

Another object of the invention is to provide a circuit which protects the power switch during a short circuit condition.

Another object of the present invention is to provide a current limit circuit for fast high side switches which does not dissipate large amounts of power across sense resistors or require a filtering-type device to protect against false limit triggering.

These, and further objects and advantages of the present invention will be made clear or will become apparent during the course of the following description of the preferred embodiment of the present invention.

DETAILED DESCRIPTION OF THE PREFERRED EMBODIMENT

Figure 1:
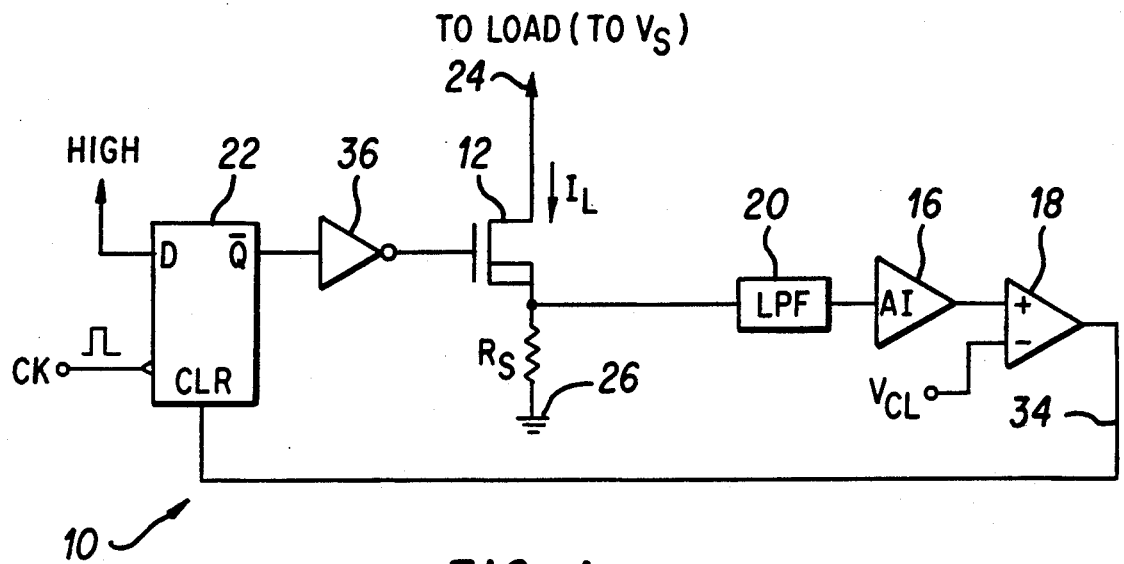
FIG. 1 is a circuit diagram of a classic current-limit circuit.
Figure 2:
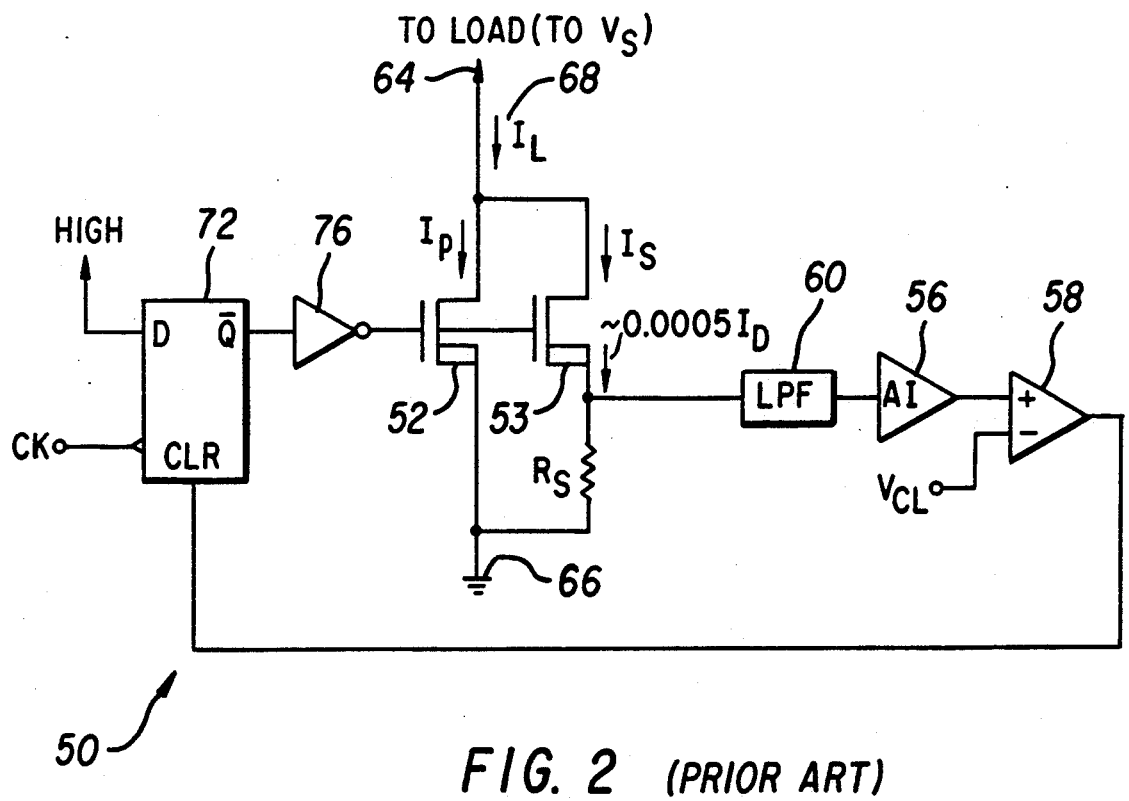
FIG. 2 is a circuit diagram of current mirror circuit in a low side switch.
Figure 3:
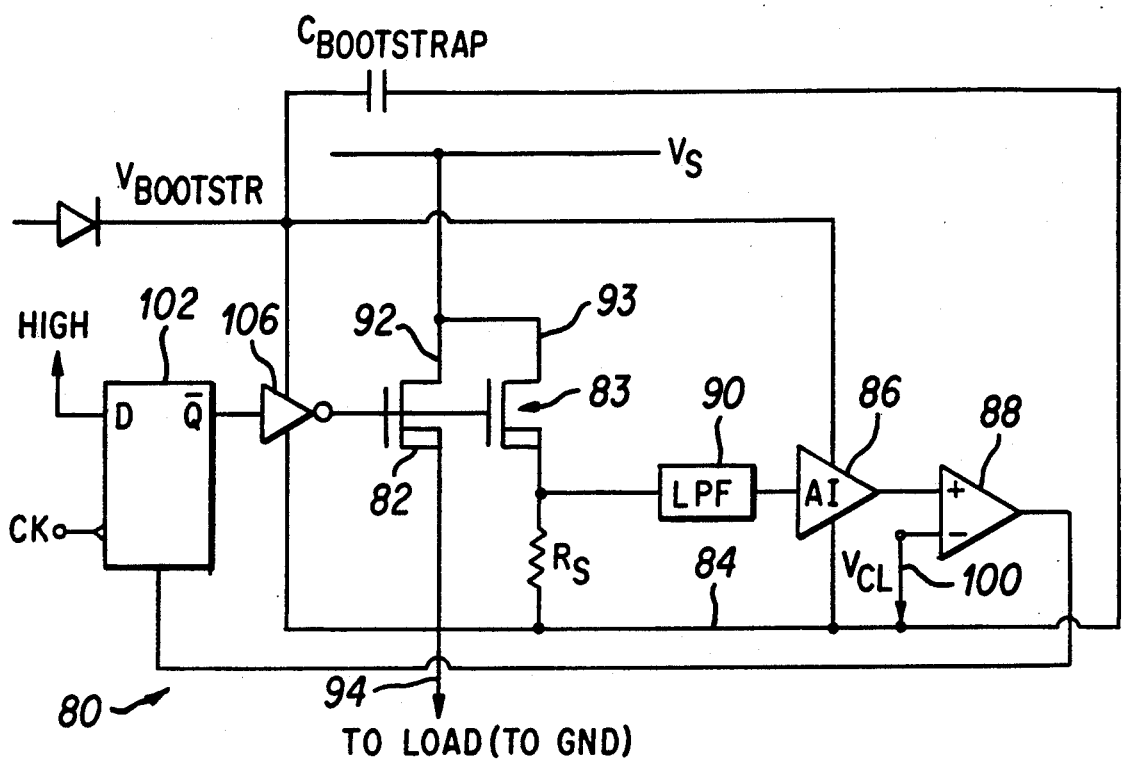
FIG. 3 is a circuit diagram of a current mirror circuit in a high side switch.
Figure 4:
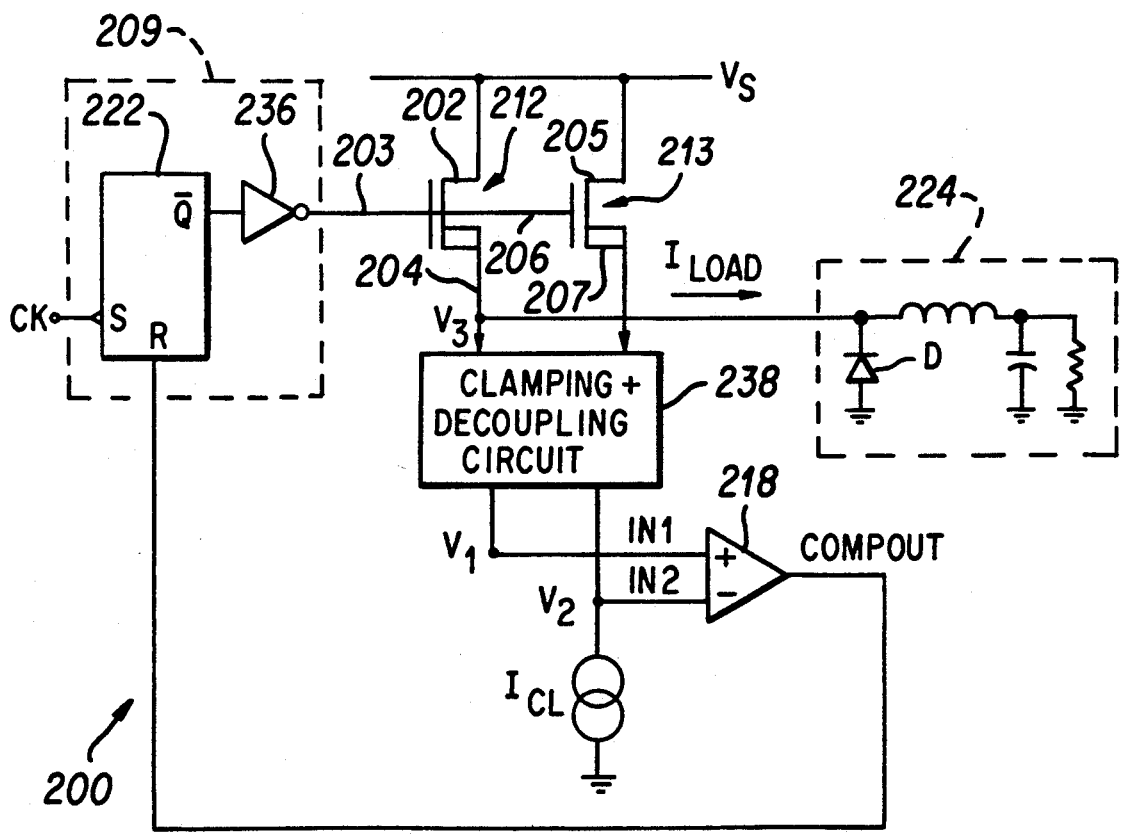
FIG. 4 is a circuit diagram of a current mirror circuit of the present invention.
Figure 5:
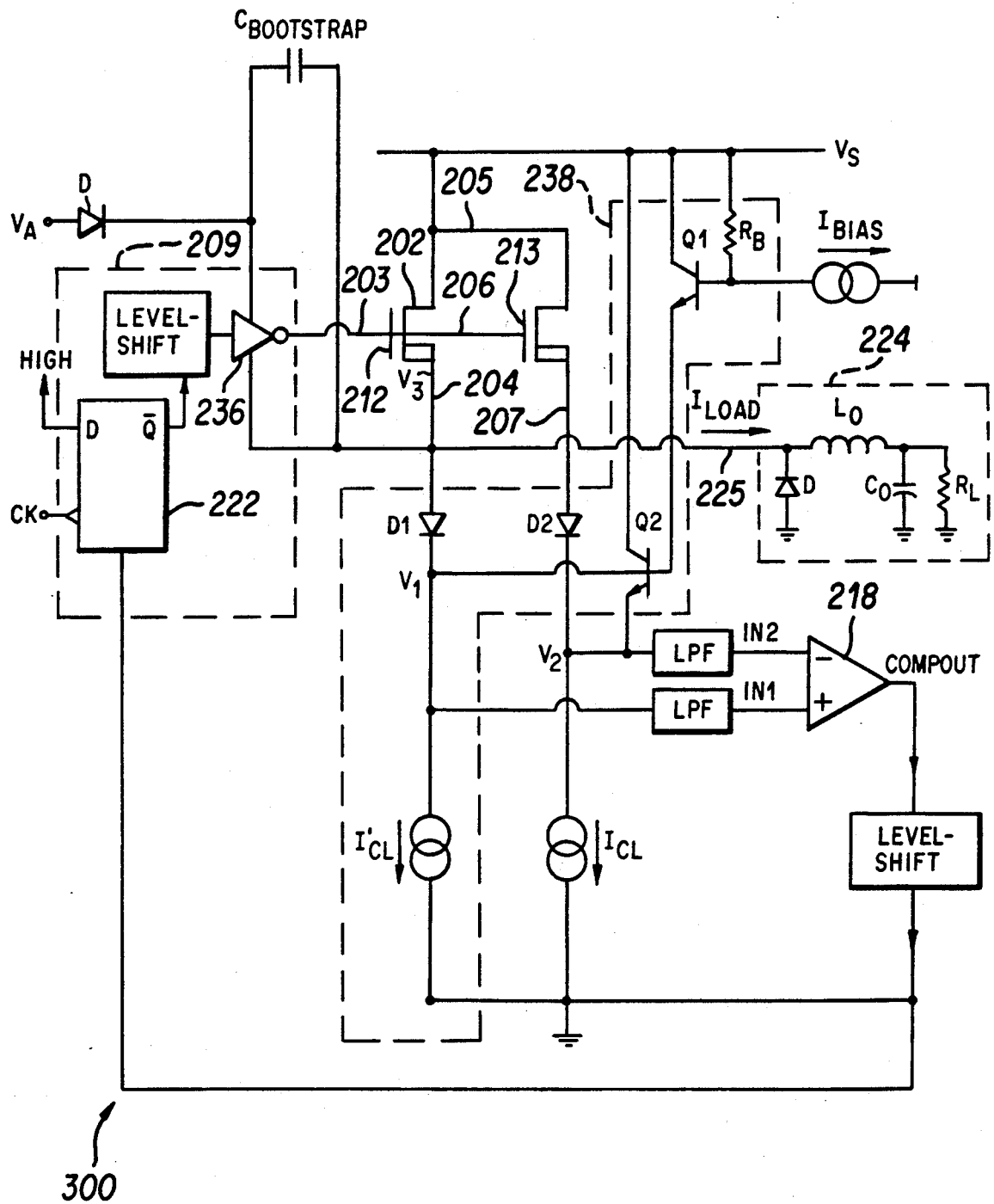
FIG. 5 is circuit diagram of another circuit of the present invention.

Referring to FIGS. 4 and 5, current limiting circuits 200, 300, for instantaneously limiting the peak current of high-side switches, are shown. The circuit 200 is comprised of two FETs 212, 213: a power FET 212 and a reference FET 213; a comparator 218; a current source (I$_{CL}$); a control circuitry 209 including a flip flop 222 and an inverter 236; and a clamping and decoupling circuit 238. The reference FET 213 is substantially smaller than the Power FET 212 and, in the preferred embodiment, the FETS are MOS FETs.

The power MOS-FET 212 consists of N cells and the reference MOS-FET 213 consists of n cells where n$>$=1 an d N$>>$n. The Power FET 212 has three terminals 202, 203, 204: the first terminal 202 is connected to a supply voltage V$_S$; the second terminal 203 is connected to the control circuitry 209 which turns the power FET 212 ON and OFF; and the third terminal 204 is the output terminal, which is connected to a load, 224.

The reference FET 213 also has three terminals: the first terminal 205 is connected to V$_S$, second terminal 206 is connected to the second terminal 203 of the power FET 212 and the third terminal 207 is connected to the current source, I$_{CL}$.

The ON resistance of the power MOS transistor 212 can be viewed as operating like a current sense resistor. However, because of the variability of the ON resistance of such devices over temperature and processing variations, the second FET (or reference FET) 213 is employed to provide an ON resistance which is proportional to and which tracks the ON resistance variations of the Power FET 212. Because the ON resistance of reference FET 213 is proportional to and tracks the ON resistance of Power FET 212, I$_{CL}$ can be set up to provide a reference voltage across reference FET 213 against which the voltage drop across the Power FET 212 can be compared.

I$_{CL}$ therefore can be selected to produce a voltage drop across the reference FET 213 which equals the voltage drop across the power FET 212 when the current through the power FET 212 equals the level at which current limiting is desired to occur. The ON resistance of the reference FET 212 is dependent upon process parameters and temperature, and weakly dependent on the voltage between the second terminal 206 and the third terminal 207 if $V_{GS} >> V_{TH}$, where $V_{TH}$ is the threshold voltage of the FET 212.

The voltage drop across the turned-on power MOSFET 212 is much higher than the maximum allowed voltage drop on the prior art sense resistors $R_S$ in the senseFET type current limit circuits 50, 80 which required an amplifier 56, 86 in order to increase the sense voltage into the comparators 58, 88. Hence, no current amplifier ($A_I$) is needed, and therefore the physical layout of the circuit is smaller than the physical layout in the sense-FET current limit circuits 50, 80.

The reference FET 213 establishes the current limit set point. The load 224 is connected to the output of the power FET 204. A voltage, $V_1$, out of the Power FET 212 is input into the comparator 218 for comparison with a voltage, $V_2$, out of the reference FET 213. The comparator output COMPOUT is input into the logic circuitry 209 and triggers the logic circuitry 209 to output a signal which controls whether the power FET 212 is to be turned ON/OFF.

The current source $I_{CL}$ establishes a known current through the reference FET 213 and the reference voltage V2 is determined by the ON resistance of FET 213. Since the two FETS 212, 213 have the same characteristics, the ON resistance of the Power FET 212 is related to the ON resistance of the Reference FET 213. The resistance of FET 213 differs from the ON resistance of the FET 212 based upon the size of the FET, but both devices 212, 213 have the same ON resistance per unit area.

The first input terminal of the comparator, IN1, is connected to the Power FET output terminal 204 through the clamping and decoupling circuitry 238. The second input terminal, IN2, is connected to the reference FET output terminal 207 through the clamping and decoupling circuitry 238. The comparator 218 compares the voltage drop across the power FET 212 to the voltage drop across the reference FET 213. It 218 outputs a signal COMPOUT which initiates the turn-off of the power FET 212 if the voltage drop across the Power FET 212, caused by the load current flowing through the power FET 212, is equal to or greater than the reference FET voltage drop induced by the current source $I_{CL}$.

The load current, $I_{LOAD}$, is switched ON by the power FET 212 and if the power switch 212 is turned ON, the voltage, $V_2$ from the reference FET 213 is set by the reference FET's ON resistance $R_{ONREF}$ and $I_{CL}$ where $$V_2 = V_S - R_{ONREF} \cdot I_{CL} - V_D \tag{1}$$

where $R_{ONREF}$ = the ON resistance of the reference FET 213

$I_{CL}$ = the current limit $V_D$ = voltage drop on the clamp and decoupling circuitry 238

The comparator 218 compares $V_2$ with $V_1$ where $$V_1 = V_2 - R_{ONPWR} \cdot I_{LOAD} - V_D \tag{2}$$

where $R_{ONPWR}$ = the ON resistance of the power FET 212

The comparator 218 resets the input flop-flop 222 in the logic circuitry 209 and turns OFF the power switch 212 (power FET) when $V_1 \leq V_2$. Hence, the power switch 212 is turned OFF if:

$$R_{ONREF} \cdot I_{CL} \leq R_{ONPWR} \cdot I_{LOAD} \tag{3}$$

$R_{ONPWR}/R_{ONREF}$ approximately equals n/N since the per cell resistance of the two devices 212, 213 is approximately equal since they are fabricated on the same piece of silicon under the same processing conditions. Hence, the load current, $I_{LOAD}$ is limited to $$I_{LOAD} = I_{CL} \cdot N/n, \tag{4}$$

where $I_{LOAD}$ is the current limit level. Hence, $I_{LOAD}$ can be programmed by the current $I_{CL}$ since $I_{CL} << I_{LOAD}$. The clamping circuitry 238 clamps the inputs to the comparator IN1, IN2 when the FETs 212, 213 are OFF to keep the comparator's 218 inputs within their active linear common mode voltage range so that the comparator 218 does not signal over current to the logic circuit 222. In addition, the clamping circuit 238 connects the comparator 218 to the FETs 212, 213 when they are ON and disconnects them when they 212, 213 are OFF.

Figure 6A:
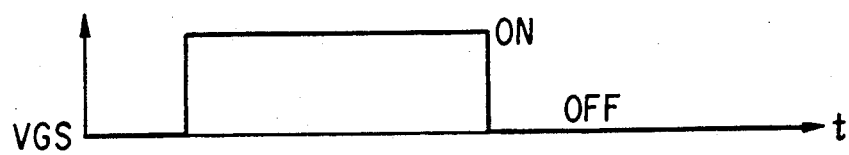
FIGS. 6a–6f are timing diagrams for circuit of FIG. 5.
Figure 6B:
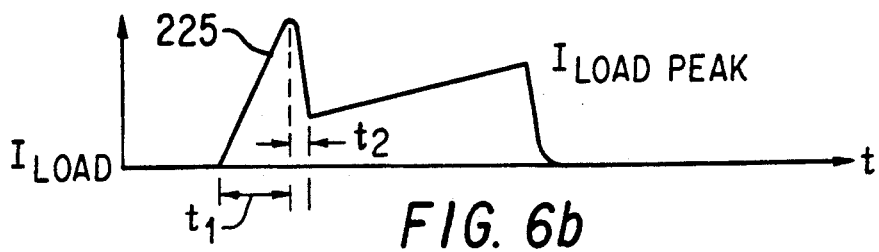
Figure 6C:
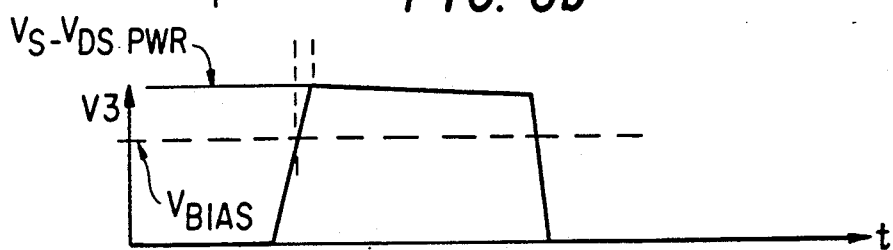
Figure 6D:
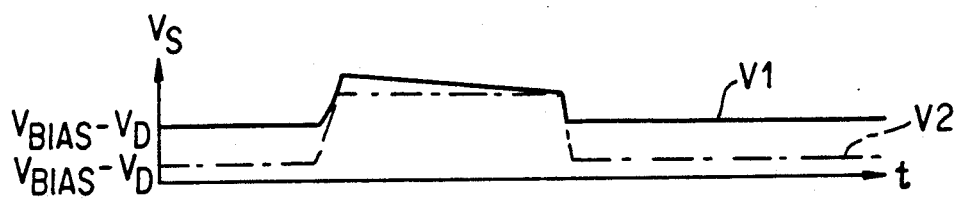
Figure 6E:

Referring to FIGS. 6 a-e also, when the power switch 212 is OFF ($V_2 < V_1$) as illustrated in FIGS. 6a and 6d, the comparator output COMPOUT is low, and as shown in FIG. 6e, the comparator 218 cannot reset the flip-flop 222 until $V_1$ the voltage out of the power FET 212, rises to nearly its final potential. By this time a current spike 225, (illustrated in FIG. 6b), caused by the reverse recovery time of a blocking diode D in the load 224 is almost entirely over.

The reverse recovery current 225 for the blocking diode D is present for a time $t_1$, during which the comparator 218 remains off. The comparator 218 is not effected by the current spike 225 which could cause false triggering of the comparator 218. The reverse recovery current 225 also produces a delayed change in the voltage $V_3$ out of the power FET 212.

Referring to FIGS. 6b and c concurrently, $V_3$ goes negative during the reverse recovery time $t_1$ of the blocking diode and then rises to its final potential $V_S - V_{DSIPWR}$ (source voltage - the drain source voltage for the Power FET) after the spike 225 has passed.

It is believed that, in this manner, the current limit circuit 200 inherently gates out the "false" current spike 225 thereby eliminating the need for a lowpass filter and decreases the time required for performing the current limit operation.

Referring to FIG. 5, another current limit control circuit 300 similar to the control circuit 200 in FIG. 4 is illustrated. The circuit 300 has a load 224 and a clamp circuit 238 having a pair of diodes D1, D2, a tracking current source $I'_{CL}$, and two bipolar junction transistors, Q1 and Q2. Similar elements are referenced with the same reference numerals/names. The load 224 includes an inductor $L_O$, a catch diode D, a capacitor $C_O$, and a load resistor $R_L$. The current limit circuitry 300 monitors and limits the load 224 by limiting the maximum peak current that is permitted to flow through the inductor $L_O$. The inductor voltage changes instantaneously but the inductor current changes slowly since $$V_{LO} = L_O \frac{di}{dt}$$

The clamp and decoupling circuit 238 is inserted between a clamp bias voltage, $V_{BIAS}$ and the comparator inputs IN1, IN2. $V_{BIAS}$ is generated relative to the supply voltage VS and it is selected so that Q1 and Q2 are OFF when FETs 212 and 213 are conducting, even at load currents which are slightly higher than $I_{LOAD}$. The clamp bias voltage $V_{BIAS}$ has roughly the same temperature coefficient as the ON-resistance of the power FET 212.

When the power FET 212 and reference FET 213 are ON, the clamp circuit 238 is not active and does not effect how the circuitry 300 operates. $V_2$ will not be higher than $V_S - I_{CL} * R_{REF}$ and $V_1$ is not clamped by Q1. However, when the FETs 212, 213 are OFF, D1 and D2 become reverse biased and the clamp circuit 238 clamps the inputs of the comparator IN1, IN2 so that the voltage on IN2 is always more positive than the voltage on IN1. Hence, the comparator output COMPOUT is low and it 218 does not signal over current. In addition the common mode voltage swing on the inputs of the comparator IN1, IN2 is limited to a substantially smaller value than the voltage swing on the output terminal 204 of the power FET 212 when FETs 212 and 213 are OFF. In this manner, it is ensured that the comparator 218 is always in its active common mode range and there is a recovery time after turn-on.

In addition, diodes $D_1$ and $D_2$ are inserted between the comparator input terminals IN1, IN2 and the output terminals 204, 207 of the power FET 212 and reference FET 213. The anode of $D_1$ is connected to the output terminal of the power FET 204, and the cathode of $D_1$ is connected to the first input terminal IN1 of comparator 218 and to the tracking current source $I'_{CL}$. The tracking current source $I'_{CL}$ tracks the current of the current source $I_{CL}$.

The anode of $D_2$ is connected to the output terminal 207 of reference FET 213 and the cathode of $D_2$ is connected to the second input terminal IN2 of the comparator 218 and to the current source $I_{CL}$.

$D_1$ and $D_2$ are blocking diodes which act like switches. $D_1$ and $D_2$ disconnect the FETs 212, 213 sources 204, 207 from the comparator inputs IN1, IN2 during the FETs' 212, 213 OFF time. Being reverse biased, the diodes $D_1$, $D_2$ take up the voltage difference between $V_{BIAS}$ and the FETs' 212, 213 output voltage which is approximately 0. Hence the diodes D1 D2 and the clamp circuit 238 limit the common mode voltage transient of the comparator's inputs IN1, IN2 thereby ensuring that the comparator inputs IN1, IN2 are always within their active common mode range and the highest possible operating speed without any recovery time.

Reference is made again to FIGS. 6a-6f illustrating the timing diagrams for the circuit 300 of FIG. 5. FIG. 6a is a timing diagram illustrating when the power switch 212 is ON, (i.e., when there is a voltage potential between the gate and source of the FET). FIG. 6b is a timing diagram illustrating the load current $I_{LOAD}$ when the power FET 213 is ON/OFF. The diode's reverse recovery time is $t_1$ and the reverse recovery current 225 looks like a "spike"; at $t_2$ the diode D reaches an equilibrium and the diode voltage begins to reverse and the diode current begins to decrease.

The ratio of $t_1$ to $t_2$ depends upon the softness of the recovery characteristic of the catch diode. However, usually $t_2 < 0.2 t_1$, where $t_2 < = 20-50$ nsec. In most cases the inherent delay of the comparator 218 takes care of the portion of $t_2$ during which $I_{LOAD} > I_{LOAD}$. When very soft recovery diodes and very fast comparators are employed, some delay (filtering) may be needed (LPF in FIG. 5). Yet, the delay needed is about an order of magnitude less than the delay needed in the classical circuit 10. Hence, this small time delay can be achieved by resistor and capacitor values available in monolithic integrated circuits. No external components are required as in the case in the substantial analog time delay of previous approaches.

As illustrated, after the diode's reverse recovery times $t_1$, $t_2$ have passed, the load current increases to $I_{LOAD\ PEAK}$, the maximum current that is allowed to flow to the load. When the maximum load current is achieved, the power switch 212 is to be turned OFF, and the comparator 218 outputs a signal, COMPOUT, as illustrated in FIG. 6e, to shut off the power switch 212.

FIG. 6e is a timing diagram of the comparator output COMPOUT. When the power FET 212 is ON, the diode D is OFF and the current $I_{LOAD}$ in the inductor rises linearly, with a slope of $$\frac{dI_L}{dt}$$

The comparator 218 is disabled by the clamp circuit 238 during most of the diode D recovery time ($t_1$) thus avoiding false limit triggering. COMPOUT is about zero when the power FET 212 is ON. But, at the end of the power switch 212 ON time, when the inductor current reaches its peak value $I_{LOAD\ PEAK}$, $V_1$ approximately equals $V_2$, COMPOUT goes high and the power switch 212 is turned OFF.

Referring to FIG. 6c, voltage $V_3$ is the voltage measured at the output of the power switch 212. $V_3$ initially goes negative during the diode's D reverse recovery time $t_1$ but then it rises to its final level of $V_S - V_{DSPWR}$, where $V_{DSPWR}$ is the drain to source voltage of FET 212. $V_3$ and $I_{LOAD}$ rapidly decreases when the FET 212 is shut OFF.

Referring also to FIG. 6d, the voltages $V_1$ and $V_2$ are shown when the power switch 212 is ON and OFF. As illustrated, initially, when the power switch 212 is OFF, $V_1 > V_2$. When the switch is ON, $V_1$ remains greater than $V_2$, but as the duration of the ON time increases, the voltage difference between $V_1$ and $V_2$ decreases such that when $V_2$ substantially equals $V_1$, the power switch 212 is turned OFF, and $V_1$ resumes being greater than $V_2$. Thus, $V_1$ is greater than $V_2$ when the power switch 212 is OFF and when the switch 212 is ON. The switch 212 is turned OFF when $V_1 = V_2$.

Figure 6F:
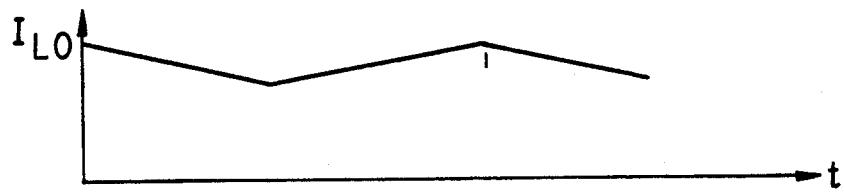

Referring to FIG. 6f, concurrently with FIG. 6b, when the switch 212 is OFF, the inductor current $I_{LO}$ is conducted by diode D. The inductor current $I_{LO}$ decreases linearly until the power switch 212 is turned ON again, at which point the inductor $L_O$ begins to store up energy and thus, the inductor current $I_{LO}$ increases linearly.

Figure 7:
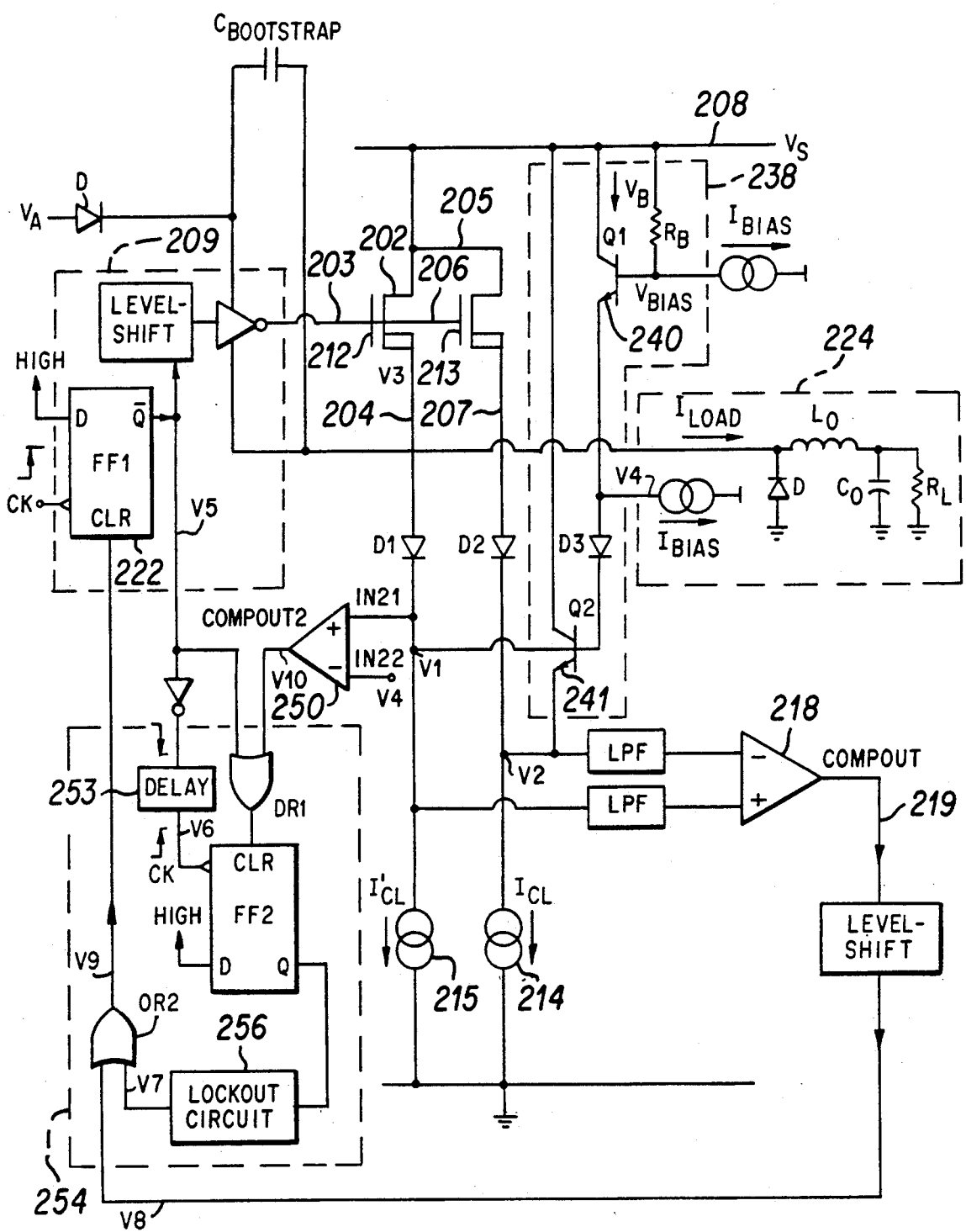
FIG. 7 is another circuit diagram of the present invention.

Reference is now made to FIG. 7 which shows another current limit circuit 400 similar to the circuit of FIG. 5, but having been modified to protect the power switch 212 if there is a short circuit between the output of the power switch 204 ($V_3$) and ground. If there is a short circuit in the circuit of FIG. 5, comparator 218 remains disabled and the power switch 212 is unprotected. The clamp circuit 238 disables the comparator 218 because otherwise, the comparator 218 would indicate overcurrent in the OFF state and it would not allow the switch 213 to be turned ON.

A second comparator 250 monitors the voltage $V_3$ at the output of the power FET 212 to determine if the voltage, $V_3$out of the power switch 212 rises above the bias voltage $V_{BIAS}$ when the Power FET 212 is ON. If it does, it means that power FET 212 is operating normally and is protected against over current by comparator 218. As previously discussed, $V_{BIAS}$ is selected so that Q1 and Q2 are OFF even when the load current is greater than $I_{LOAD}$.

$V_{BIAS}$ should be chosen so that $V_s - V_{BIAS} > V_s - V_3$ under any circumstance if the switch 213 is ON and the load current is smaller or equivalent with the maximum possible current limit value. For example, in the preferred embodiment, $V_{BIAS}$ is two times the current limit value.

The second comparator 250 has two input terminals IN21 and IN22 and an output terminal COMPOUT2. The voltage out of COMPOUT2 is $V_{10}$. IN21 is connected to the Power FET 212 output 204, through the D1 diode ($V_1$). IN22 is connected to $V_4$, a voltage slightly above the clamped (minimum) value of $V_1$.

COMPOUT2 is connected to a timer-logic circuit 254 comprising a second flip-flop FF2, a delay element 253, a lock out circuit 256, and an OR gate OR1. $V_1$ is the voltage on the first input IN21 into the second comparator 250 and $V_4$ is the voltage on the second input IN22.

Reference is now made to FIG. 7 concurrently with FIGS. 8a-8k which illustrate the no short circuit condition. FIG. 8a is a diagram illustrating the clock pulses received by FF1, FIG. 8b illustrates the load current $I_{LOAD}$, when the power FET 212 is ON/OFF where the spike 225 is the reverse recovery current and $I_{LOAD\ PEAK}$ is the peak load current turned OFF. FIG. 8c is a diagram illustrating the voltage $V_3$ out of the power FET 212 where the voltage initially stays negative during the diode reverse recovery time. The voltage then rises to its final level when power FET 212 is ON and decreases rapidly when the FET 212 is shut OFF. Referring to FIG. 8d, the power switch 212 is ON when $V_1 > V_2$. Initially, when the power switch 212 is OFF, $V_1 > V_2$ and when the switch 212 is ON, $V_1$ remains greater than $V_2$ but as the inductor current is increasing during the ON time, the voltage difference between $V_1$ and $V_2$ decreases such that when $V_2$ substantially equals $V_1$, the poWer switch 212 is turned OFF and $V_1$ resumes being greater than $V_2$.

Figure 8:
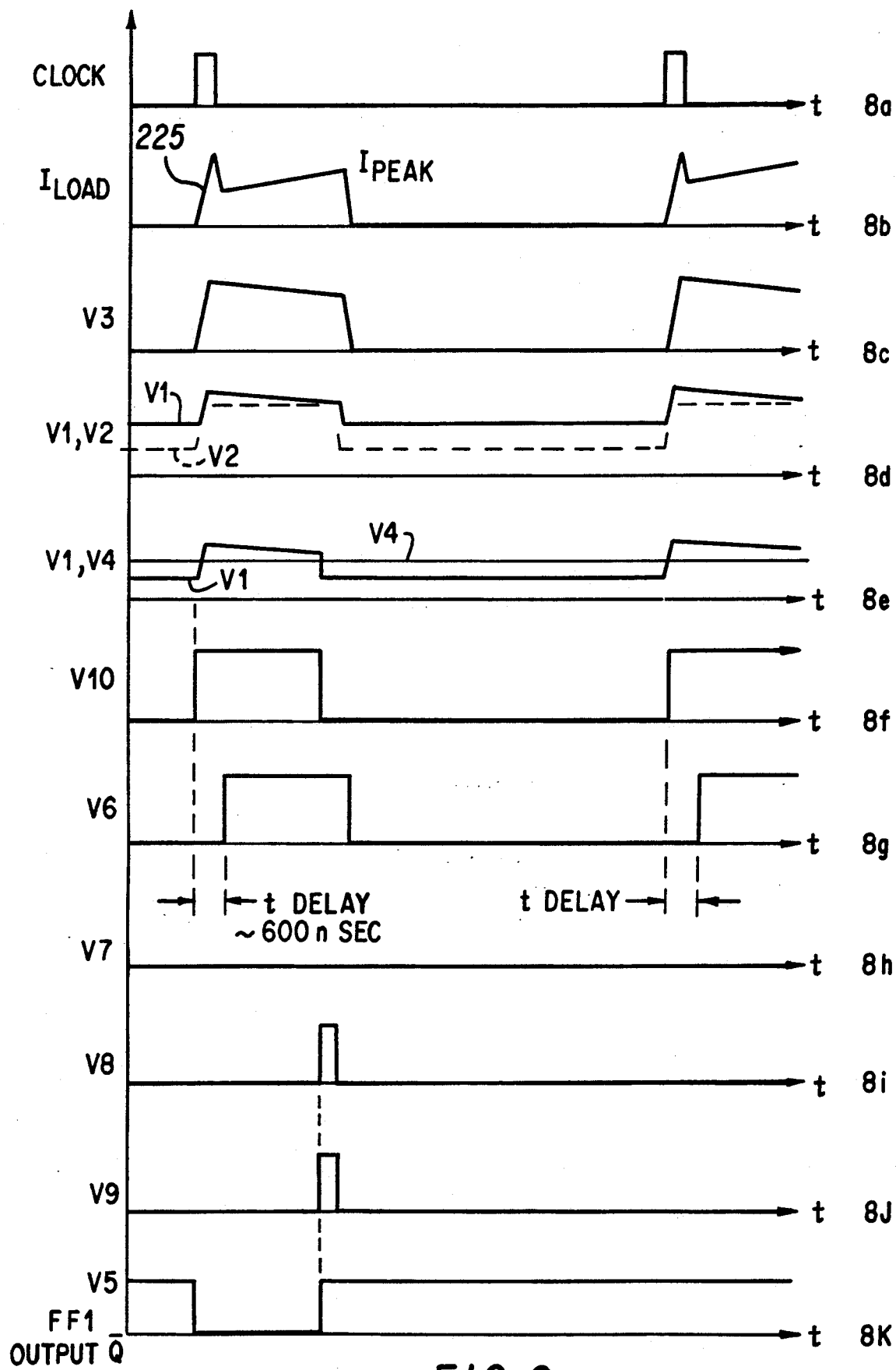
FIGS. 8a–8k are diagrams corresponding to the circuit of FIG. 7 for the no short circuit condition.

Referring to FIG. 8, $V_4$ is the clamp voltage which is set higher than the drain source voltage of the power FET 212 at the maximum foreseeable load current (e.g., two times the maximum drain source voltage of FET 212).

Referring particularly to FIGS. 8e-8k, in the no short circuit condition, when power FET 212 is ON, $V_1 > V_4$ and the second comparator 250 outputs a logic high into OR1. The $\overline{Q}$ output from FF1 is also input into OR1. The logic high on output OR1 generated by the second comparator's output COMPOUT2 keeps a logic one on the CLEAR input of FF2, which in turn keeps the Q output of FF2 low. The lock-out circuit 256 is not triggered because it is triggered by a logic 1. The output of the lock-out circuit $V_7$ is delayed. $V_7$ is input into a second OR gate OR2 along with COMPOUT. COMPOUT is high when $V_1$ approximately equals $V_2$ as illustrated in FIG. 8i. OR2 outputs a logic high when COMPOUT=1. The OR2 output $V_9$ is input into the clear of FF1 where Q remains high and $\overline{Q}$ is a logic low as illustrated in FIG. 8k. $\overline{Q}$ is then input into an inverter which inverts $\overline{Q}$ or $V_5$ from a logic low to a logic high, or $V_5$ corresponds to the output $\overline{Q}$ of FF1. When $\overline{Q}$ is low, the power FET 212 is ON. After having been inverted by an invertor, $\overline{Q}$ is input into a delay element 253 having a delay of $t_{delay}$.

The delay time, $t_{delay}$, is selected to be long enough to accommodate for the reverse recovery time of the worst case diode. In the preferred embodiment, a delay time of 5–600 nsec is a selected. In addition, the clamp voltage $V_S-V_4$ is set higher than the drainsource voltage of FET 212 at the maximum foreseeable load-current (e.g., two times the maximum of $V_{DS}$). $V_6$ corresponds to the output of the delay element 253 which is the CLOCK input of FF2. Its positive going transition triggers FF2 $t_d$ after the turn ON of the Power FET 212 unless it is cleared through the second comparator 250, as is the case during normal operation as discussed above.

Since $R_{DSON}$ of FET 212 is highly temperature dependent, the clamp voltage $V_4$ selected will be valid over a wide temperature range only if $V_B$ has approximately the same temperature coefficient as $R_{DSON}$, where $V_B = V_S - V_{BIAS}$. $R_{DSON}$ has a temperature coefficient of approximately +6800 ppm/° C. $V_B$ can achieve approximately the same temperature coefficient $T_C$ as $R_{DSON}$ by using a diffused resistor with a $T_{CR}$ of 2000–3000 ppm/° C. and a current source ($I_{BIAS}$) with a temperature coefficient $T_{CIB} = 6800 - T_{CR}$.

Referring to FIGS. 8f and 8h, $V_{10}$ is the voltage signal out of the second comparator 250. When the power switch 212 turns on $V_3$ goes high, and $V_{10}$ goes high also. $V_{10}$ goes high because the comparator 250 senses that $V_1$ is higher than $V_4$. Hence, as long as $V_{10}$ is high, the Q output of FF2 and the output $V_7$ of the lock out circuit 256 cannot go high.

Referring to FIG. 8g, $V_6$ is the voltage out of the delay circuit 253. The delay circuit 253 is triggered when switch 212 is turned on and $V_6$ is a positive edge when the preset time delay $t_{delay}$ has passed. When the positive edge of $V_6$ comes, $V_{10}$ is still high and $V_6$ cannot set FF2 so the delay cannot initiate turn off of the circuit 400. Thus, as long as $V_1$ is greater than $V_4$, the short circuit protection circuitry is not active.

Referring to FIGS. 9a-9k diagrams corresponding to the short circuit condition for the circuit of FIG. 7 are illustrated. If $V_3$ rises above $V_4$, then the power switch 212 is operating normally and the current through the FET 212 is limited by the comparator 218. If, due to a short circuit, or an excessive load on the output of the power switch 212, $V_3$ can not rise above $V_4$, then the signal out of the delay element 253 triggers the second flip-flop 252, after a preset delay time has elapsed. The second flip-flop 252, in turn, sends a signal to the first flip-flop 222 to clear the flip-flop 222, so that the power switch 212 is turned OFF.

When there is a short circuit, the lockout circuit 256 which may be a one shot, keeps the CLEAR input of the first flip-flop FF1 high for a predetermined time in order to ensure that the power sWitch 212 cannot be turned ON before the predetermined time has elapsed. The lock out circuit 256 disables the power FET 212 when the second comparator 250 turns off the power switch 212 in order to limit the maximum duty cycle in short circuit. The maximum duty-cycle during short circuit is limited to $t_{delay}/t_{lockout}$ and thus the average current of the power switch 212 is limited.

Figure 9:
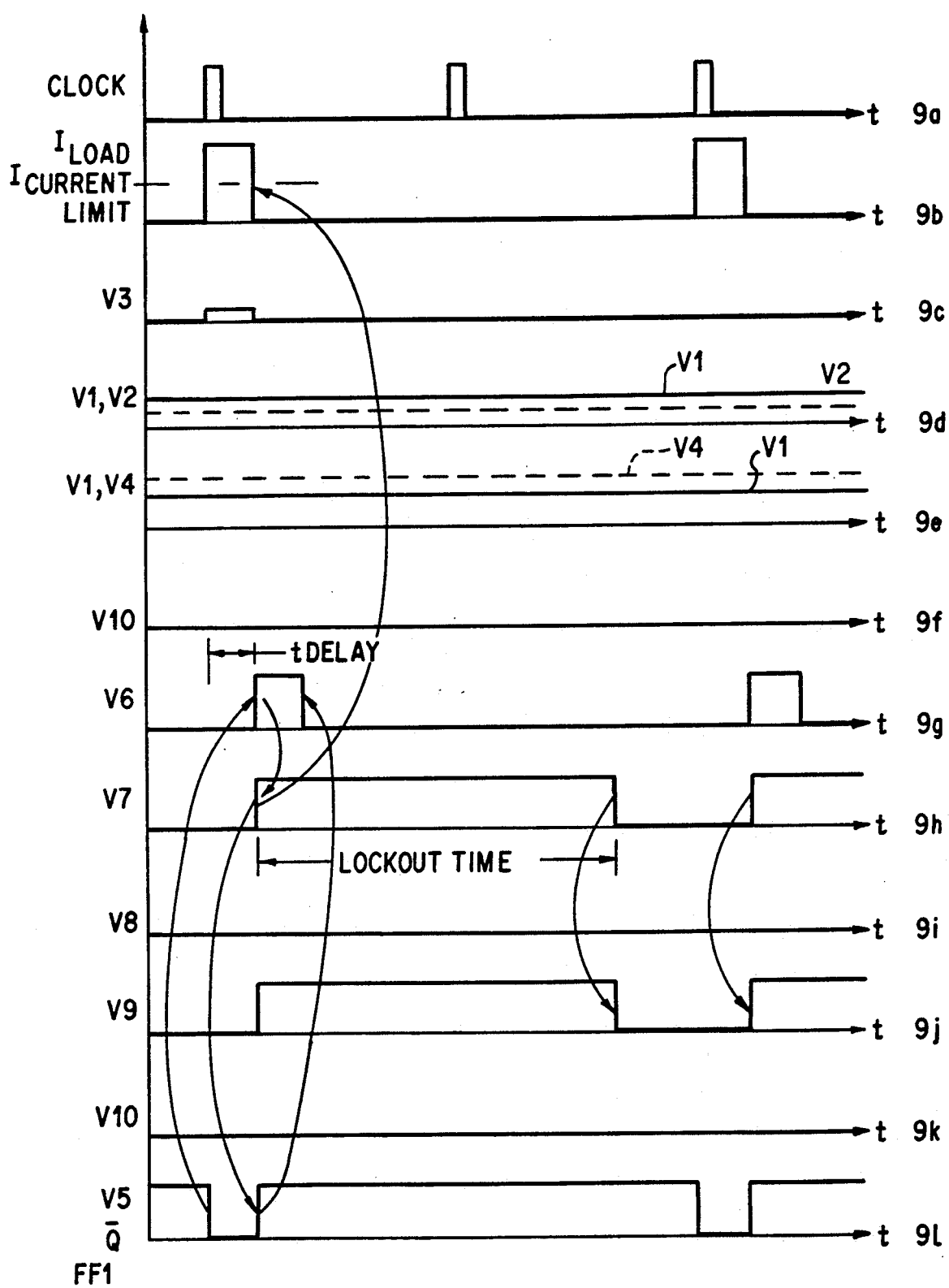
FIGS. 9a–9k are diagrams similar to FIGS. 8a–8k, for the short circuit condition.

As diagrammed in FIG. 9b, the load current $I_{LOAD}$ is greater than the current limit level and as shown in FIG. 9c, the voltage $V_3$ out of the power FET 212 is very small in comparison to the load current $I_{LOAD}$. $V_1$ remains higher than $V_2$ because of the clamp circuit 238. (FIG. 9d) The clamp voltage $V_4$ is higher than $V_1$ (FIG. 9e) such that the second comparator 250 output $V_{10}$ is a logic zero (FIG. 9f) and the delay element 253 outputs a delayed clock signal $V_6$ after the associated delay time (FIG. 9g).

The positive edge of $V_6$ sets $V_7$ (FIG. 9h). When $V_6$ is high, FF2 is triggered and $V_7$ is set through the lockout circuit 256 to be positive. $V_7$ remains positive for a predetermined time: the duration of the lock-out time, $t_{lockout}$. All further input clock pulses are ignored and, in this way, FF1 is disabled. $\overline{Q}V_5$ out of FF1 is 1 and FET 212 is shut OFF until the lockout-time has elapsed, since the invertor inverts $\overline{Q}$ thereby keeping the power FET 212 OFF. In this manner the OFF period is extended to ensure that the duty cycle is short during the short circuit condition.

Having thus described the invention, it is recognized that those skilled in the art many make various modifications or additions to the preferred embodiment chosen to illustrate the invention without departing from the spirit and scope of the present contribution to the art. Accordingly, it is to be understood that the prosecution sought and to be afforded hereby should be deemed and to extend to the subject matter claimed and all equivalents thereof within the scope of the invention.

I claim:

1. A current control circuit for use in switching regulator circuits including:
   a MOS device that is turned off and on to supply current to a load over a periodic, controllable duration of time, wherein the MOS device has an internal resistance which causes a voltage drop over the MOS device to increase substantially linearly for a linear increase in current flowing through the MOS device, and wherein there is a current limit voltage drop across the MOS device when the current flowing through the MOS device is at a level at which current limiting is desired; and
   means responsive to the voltage drop across the MOS device for switching off the MOS device when the current limit voltage is reached.

2. The circuit of claim 1 wherein the means for switching has associated therewith an active common mode voltage range and further including:
   means for clamping the means for switching when the MOS device is turned off so that the means for switching operates in the active common mode voltage range.

3. The circuit of claim 2, wherein the clamping means comprises a transistor.

4. The circuit of claim 1, wherein the means for switching includes:
   means for monitoring the voltage drop across the MOS device and for switching off the MOS device if the voltage drop across the MOS device is not below a preselected level during a preselected time period.

5. The circuit of claim 2, further comprising:
   means for decoupling the means for switching from the MOS device when the MOS device is off.

6. A current control circuit, comprising:
   a power device having a substantially linear operating range associated therewith that is turned off and on to supply current to a load over a periodic, controllable duration of time, wherein the power device has an internal resistance such that, for a specified current level through the power device wherein the specified current level within the substantially linear operating region of the power device, there is a voltage drop across the power device that is substantially equal to the internal resistance multiplied by the specified current level through the power device;
   means for providing a reference voltage which is substantially equal to the voltage drop across the power device when the power device is conducting at the specified current level;
   means for comparing the reference voltage to the voltage drop across the power device to determine when the voltage drop across the power device exceeds the voltage drop across the reference device; and
   means responsive to the comparing means for switching off the power device when the specified current level is reached.

7. The circuit of claim 6, wherein the means for comparing has associated therewith an active common mode voltage range and further including:
   means for clamping the circuit when the power device is turned off so that the means for comparing operates in the active common mode voltage range.

8. The circuit of claim 7, wherein the clamping means comprises a transistor.

9. The circuit of claim 7, further comprising: means for decoupling the means for comparing from the power device when the power device is off.

10. A current control circuit, comprising:
    a power device having a substantially linear operating range associated therewith that is turned off and on to supply current to a load over a periodic, controllable duration of time, wherein the power device has an internal resistance such that, for a specific current level through the power device, wherein the specified current level is within the substantially linear operating range of the power device, there is a voltage drop across the power device that is substantially equal to the internal resistance multiplied by the specific current level through the power device;
    reference means coupled to the power device for providing a value of resistance which is proportional to and which tracks changes in the internal resistance of the power device;
    means for supplying a reference current to the reference means, wherein the amount of reference current supplied is selected so that there is a voltage drop across the reference means which substantially equals the voltage drop across the power device when a specified limit level of current is flowing through the power device;
    means for comparing the voltage drops across the power device and the reference means; and
    means responsive to the comparing means for turning the power device off when the voltage drop across the power device exceeds the voltage drop across the reference device.

11. The circuit of claim 10 wherein the means for comparing has associated therewith an active common mode voltage range and further includes:
means for clamping the circuit when the power device is turned off so that the means responsive to the voltage drop operates in the active common mode voltage range.

12. The circuit of claim 11, wherein the means for clamping comprises a transistor.

13. The circuit of claim 10, wherein the means for switching include:
means for monitoring the voltage drop across the power device and for switching off the power device if the voltage drop across the power device is not below a preselected level during a preselected time period.

14. The circuit of claim 11, further comprising:
means for decoupling the means for comparing from the power device and the reference means when the power device is off.

15. The circuit of claim 14, wherein the disconnecting means further disconnects the reference current from the reference means when the power device is off.

16. A circuit comprising:
a first MOS means having an internal resistance for connecting a load to a power source, the first MOS means being switched on and off and having a current at a first level associated therewith, wherein the current causes a voltage drop across the first MOS means which increase substantially linearly for a linear increase in current flowing through the first MOS means;
MOS means for mimicking the current flowing through the first MOS means at a lower level than the first level and for mimicking the internal resistance of the first MOS means at a higher level so that a voltage is produced across the mimicking MOS means which is substantially equal to the voltage drop across the first MOS means for the first level of current flow through it;
means for comparing the voltage across the first MOS means and the voltage across the mimicking MOS means and generating a signal indicating the results of the comparison; and
means for switching off the first MOS means when the voltage from the first MOS means is substantially equal to the voltage from the mimicking MOS means.

17. The circuit of claim 16, wherein the means for comparing has associated therewith an active common mode voltage range and further includes:
means for clamping the circuit when the first MOS means is turned off so that the means for comparing operates in the common mode active range.

18. The circuit of claim 17, wherein the clamping means comprises a transistor.

19. The circuit of claim 16, wherein the means for switching includes:
means for monitoring the voltage drop across the first MOS means and for switching off the first MOS means if the voltage drop across the first MOS means is not at below a preselected level during a preselected time period.

20. The circuit of claim 17, further comprising:
means for decoupling the means for comparing from the first MOS means and the mimicking MOS means when the first MOS means is off.

* * * * *